(12) United States Patent
Ma et al.

(10) Patent No.: US 11,894,399 B2
(45) Date of Patent: Feb. 6, 2024

(54) COMPACT HYPERSPECTRAL SPECTROMETERS BASED ON SEMICONDUCTOR NANOMEMBRANES

(71) Applicants: Wisconsin Alumni Research Foundation, Madison, WI (US); The Research Foundation for the State University of New York, Amherst, NY (US)

(72) Inventors: Zhenqiang Ma, Middleton, WI (US); Zhenyang Xia, Madison, WI (US); Ming Zhou, Middleton, WI (US); Qiaoqiang Gan, Buffalo, NY (US); Zongfu Yu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 491 days.

(21) Appl. No.: 17/189,394

(22) Filed: Mar. 2, 2021

(65) Prior Publication Data
US 2022/0285411 A1    Sep. 8, 2022

(51) Int. Cl.
| | |
|---|---|
| *H01L 27/146* | (2006.01) |
| *G01J 3/02* | (2006.01) |
| *G01J 3/28* | (2006.01) |
| *H04N 23/11* | (2023.01) |

(52) U.S. Cl.
CPC ........ *H01L 27/14605* (2013.01); *G01J 3/021* (2013.01); *G01J 3/2803* (2013.01); *G01J 3/2823* (2013.01); *H01L 27/14629* (2013.01); *H04N 23/11* (2023.01); *G01J 2003/2813* (2013.01); *G01J 2003/2826* (2013.01)

(58) Field of Classification Search
CPC .... G02B 26/001; G01J 3/26; G01J 2003/262; G01J 2003/265; G01J 2003/267; G01N 21/0303; H01L 27/14605; H01L 27/14629
See application file for complete search history.

(56) References Cited

U.S. PATENT DOCUMENTS

| | | | |
|---|---|---|---|
| 5,227,648 A | 7/1993 | Woo | |
| 5,583,338 A | 12/1996 | Goodwin | |
| 7,817,281 B2 * | 10/2010 | Kiesel | H01S 3/08081 356/519 |
| 7,982,296 B2 | 7/2011 | Nuzzo et al. | |

(Continued)

FOREIGN PATENT DOCUMENTS

| | | |
|---|---|---|
| CN | 1118-47375 A | 10/2020 |
| JP | 2009-210474 A | 9/2009 |
| JP | 2012-154780 A | 8/2012 |

OTHER PUBLICATIONS

International Search Report and Written Opinion for PCT/US2022/070689, dated May 31, 2022, pp. 1-9.

(Continued)

*Primary Examiner* — Raj R Gupta
(74) *Attorney, Agent, or Firm* — Bell & Manning, LLC

(57) ABSTRACT

Hyperspectral resonant cavity imaging spectrometers and imaging systems incorporating the resonant cavity spectrometers are provided. The spectrometers include an array of photodetectors based on photosensitive semiconductor nanomembranes disposed between two dielectric spacers, each of the dielectric spacers having a thickness gradient along a lateral direction, such that the resonant cavity height differs for different photodetectors in the array.

19 Claims, 12 Drawing Sheets

(56) References Cited

U.S. PATENT DOCUMENTS

| | | | |
|---|---|---|---|
| 9,653,640 | B2 | 5/2017 | Ma et al. |
| 10,777,700 | B2 | 9/2020 | Ma et al. |
| 2003/0190126 | A1 | 10/2003 | Toyoshima et al. |
| 2007/0148760 | A1* | 6/2007 | Klesel .............. G01J 3/0262 356/519 |
| 2009/0294785 | A1* | 12/2009 | Cok .............. H10K 50/85 257/E33.001 |
| 2011/0032214 | A1* | 2/2011 | Gruhlke .............. G06F 3/0421 359/291 |
| 2013/0127922 | A1* | 5/2013 | Poliakov .............. G02B 5/0215 359/292 |
| 2018/0340826 | A1 | 11/2018 | Scherer et al. |
| 2018/0351024 | A1 | 12/2018 | Ma et al. |
| 2021/0372853 | A1* | 12/2021 | Borremans .......... G01J 3/2823 |

OTHER PUBLICATIONS

Liu et al., "Semiconductor Nanomembrane-Based Light-Emitting and Photodetecting Devices," *Photonics* 2016,, 3, 40, 19 pages.

Ji et al., "Angle-tolerant linear variable color filter based on a tapered etalon," *Optics Express*, vol. 25, No. 3, Feb. 2017, 9 pages.

Emadi et al., "Linear variable optical filter-based ultraviolet microspectrometer," *Applied Optics*, vol. 51, No. 19, Jul. 2012, pp. 4308-4315.

Xia et al., "Single-crystalline germanium nanomembrane photodetectors on foreign nanocavities," *Sci. Adv.*, 2017; 3: e1602783, Jul. 7, 2017.

Kats et al., "Enhancement of Absorption and Color Contrast in Ultra-Thin Highly Absorbing Optical Coatings," *Applied Physics Letters*, 103 [10]; 10114, 6 pages.

Yang et al., "Microscopic Interference Full-Color Printing Using Grayscale-Patterned Fabry-Perot Resonance Cavities," *Adv. Optical Mater.* 2017, 1700029-1700037.

Lopez-Sanchez, Oriol, et al., Ultrasensitive photodetectors based on monolayer MoS2, Nature Nanotechnology 10.1038/NNANO.2013. 100, Jun. 9, 2013, pp. 1-6.

Thongrattanasiri, Sukosin, et al., Complete Optical Absorption in Periodically Patterned Graphene, Phys. Rev. Lett. 108.047401, Jan. 27, 2012, pp. 047401-047405.

Cho, Minkyu, et al., Resonant cavity germanium photodetector via stacked single-crystalline nanomembranes, J. Vac. Sci. Technol. B 34(4), May 2, 2016, pp. 040604-1 to 040604-4.

Seo, Jung-Hun, et al., Flexible Phototransistors Based on Single-Crystalline Silicon Nanomembranes, Adv. Optical Mater. 4:1 (Jan. 2016), Oct. 26, 2015, pp. 120-125.

Yang, Hongjun, et al., Transfer Printed Nanomembranes for Heterogeneously Integrated Membrane Photonics, Photonics 2015, 2, Nov. 13, 2015, pp. 1081-1100.

Song, Haomin, et al., Nanocavity Enhancement for Ultra-Thin Film Optical Absorber, Adv. Mater. 26:17 (May 7, 2014), Feb. 24, 2014, pp. 2737-2743.

Kats, Mikhail A., et al., Nanometre optical coatings based on strong interference effects in highly absorbing media, Nature Materials 12.1, Jan. 2013, pp. 20-24.

Wang, Jian, et al., Ge-Photodetectors for Si-Based Optoelectronic Integration, Sensors 11, Jan. 12, 2011, pp. 696-718.

Yi, Soongyu, et al., A multiple-resonator approach for broadband light absorption in a single layer of nanostructured graphene, Optics Express 23:8, Apr. 10, 2015, pp. 10081-10090.

Lee, Kyu-Tae, et al., Colored ultrathin hybrid photovoltaics with high quantum efficiency, Light: Science & Applications 3, Aug. 3, 2014, pp. e215.

Janisch, Corey, et al., MoS2 monolayers on nanocavities: enhancement in light-matter interaction, 2D Materials 3, Apr. 28, 2016, pp. 025017.

Masini, G., et al., Advances in the field of poly-Ge on Si near infrared photodetectors, Materials Science and Engineering B69-70, Jan. 14, 2000, pp. 257-260.

Kats, Mikhail A., et al., Optical absorbers based on strong interference in ultra-thin films, Laser and Photonics Reviews 10:5, Sep. 22, 2016, pp. 699.

* cited by examiner

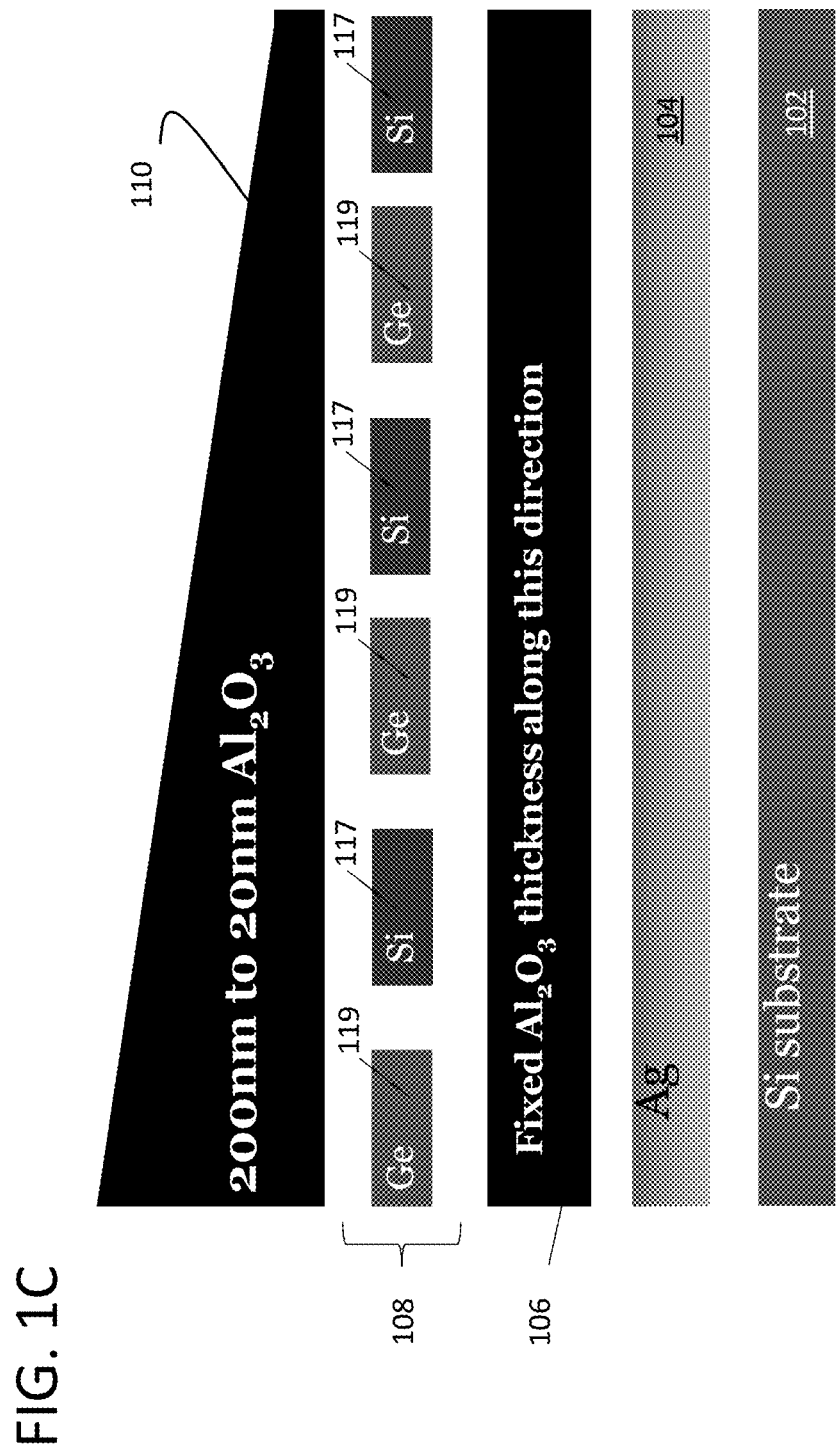

COMPACT HYPERSPECTRAL SPECTROMETERS BASED ON SEMICONDUCTOR NANOMEMBRANES

REFERENCE TO GOVERNMENT RIGHTS

This invention was made with government support under DE-NA0002915 awarded by the US Department of Energy. The government has certain rights in the invention.

BACKGROUND

Hyperspectral imaging technology, as an advanced remote sensing tool, has many applications in the imaging of geology, vegetation, the atmosphere, hydrology, and other environments. Traditional spectrometers are composed of several discrete components, including optical focusing and collimating lenses, optical prisms for spectral dispersion, and detector arrays for optical signal detection and readout. Such discrete-component spectrometer systems are generally confined to use in laboratories and are impractical for mobile applications because they are bulky, expensive, and delicate systems. In addition, because conventional spectrometers operate based on the principles of ray optics, they are not suited for imaging objects or features having dimensions smaller than the scale of one wavelength.

SUMMARY

Hyperspectral resonant cavity imaging spectrometers and imaging systems incorporating the resonant cavity spectrometers are provided.

One embodiment of a hyperspectral resonant cavity spectrometer includes: a first reflector; a first dielectric spacer disposed over the first reflector, the first dielectric spacer having a thickness gradient along a lateral direction; a second dielectric spacer disposed above the first dielectric spacer, the second dielectric spacer having a thickness gradient along a lateral direction; and a pixel array comprising a plurality of photodetectors, the photodetectors comprising photosensitive semiconductor nanomembranes, disposed between the first dielectric spacer and the second dielectric spacer, wherein the first reflector, the first dielectric spacer, and the second dielectric spacer define a resonant cavity having a cavity height gradient along at least one lateral direction.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1C. Cross-sectional view of the spectrometer of FIG. 1A taken along the y-axis.

DETAILED DESCRIPTION

Hyperspectral resonant cavity imaging spectrometers and imaging systems incorporating the resonant cavity spectrometers are provided. The spectrometers include an array of photodetectors comprising photosensitive semiconductor nanomembranes disposed between two dielectric spacers, each of which has a thickness gradient along a lateral direction. The two dielectric spacers define a resonant cavity having a cavity height gradient along at least one lateral direction. By incorporating the array of photosensitive semiconductor nanomembrane-based photodetectors ("pixels") into the resonant optical cavity structure, the spectrometers are able to enhance light-matter interactions based on a nanocavity interference mechanism, which greatly enhances the light absorption by the thin photosensitive semiconductor nanomembranes. The use of an optical cavity having a cavity height gradient makes it possible for each photodetector to have a unique photoresponse, enabling the spectrometers to detect radiation over a broad range of wavelengths with a very high resolution. Moreover, because nano-scale pixels are used, a high pixel density is possible, with a greater number of pixels corresponding to a higher resolution. As a result, the hyperspectral imaging spectrometers can collect and process information over a broad band of electromagnetism and provide spectra that enable the user to precisely analyze the chemical composition of a sample. The design of the spectrometers allows them to be fast, compact, and lightweight, and therefore easily portable. As a result, embodiments of the spectrometers can be integrated into small scale analytical instruments, such as cellular phone cameras, for use in the field.

The hyperspectral spectrometers and imaging systems have applications in a variety of fields, including mapping of wide areas, target detection, process monitoring and control, object identification and recognition, clinical diagnosis imaging, and environment assessment and management.

Figure 1A:
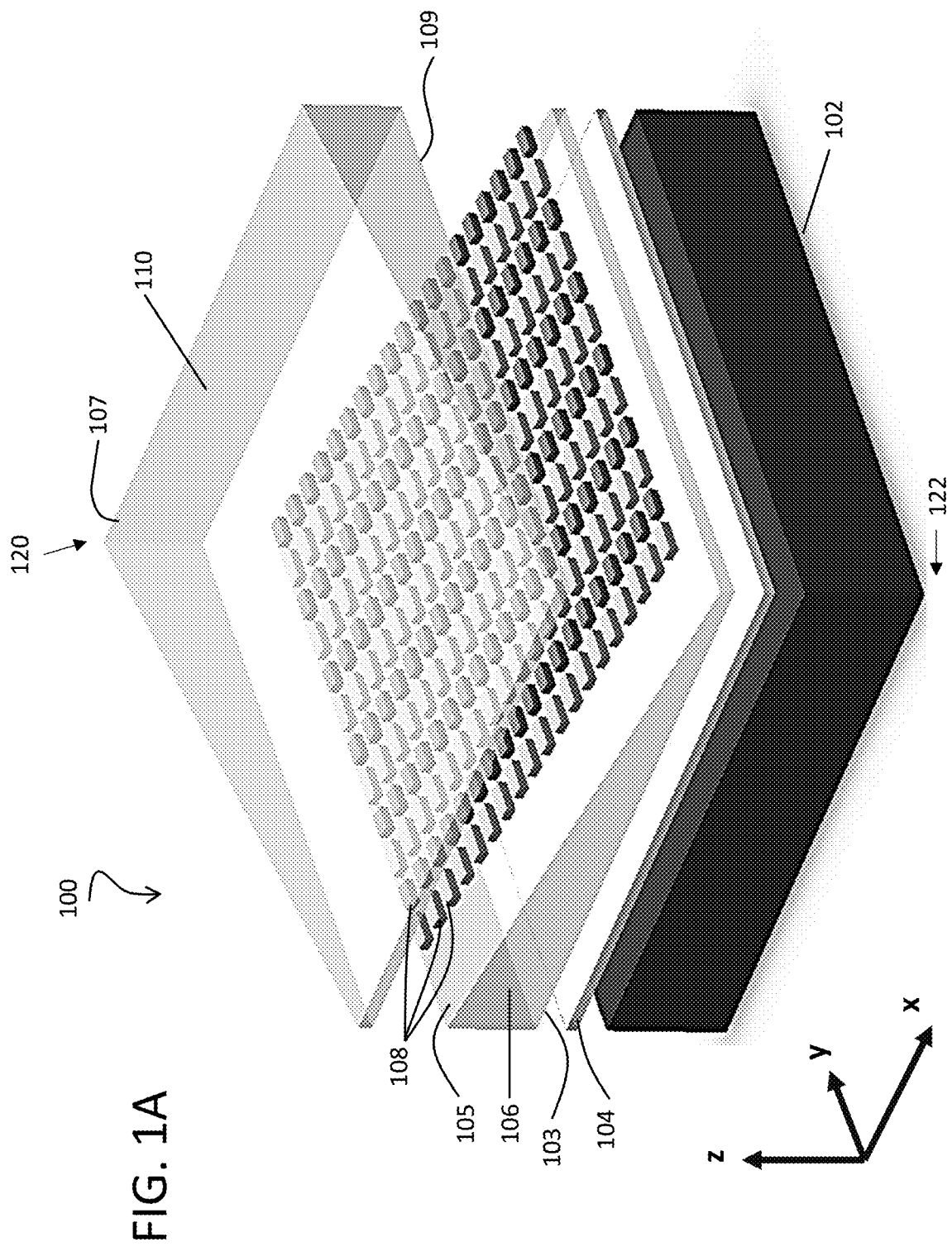
FIG. 1A. Exploded view of the components of one embodiment of a hyperspectral spectrometer.
Figure 1B:
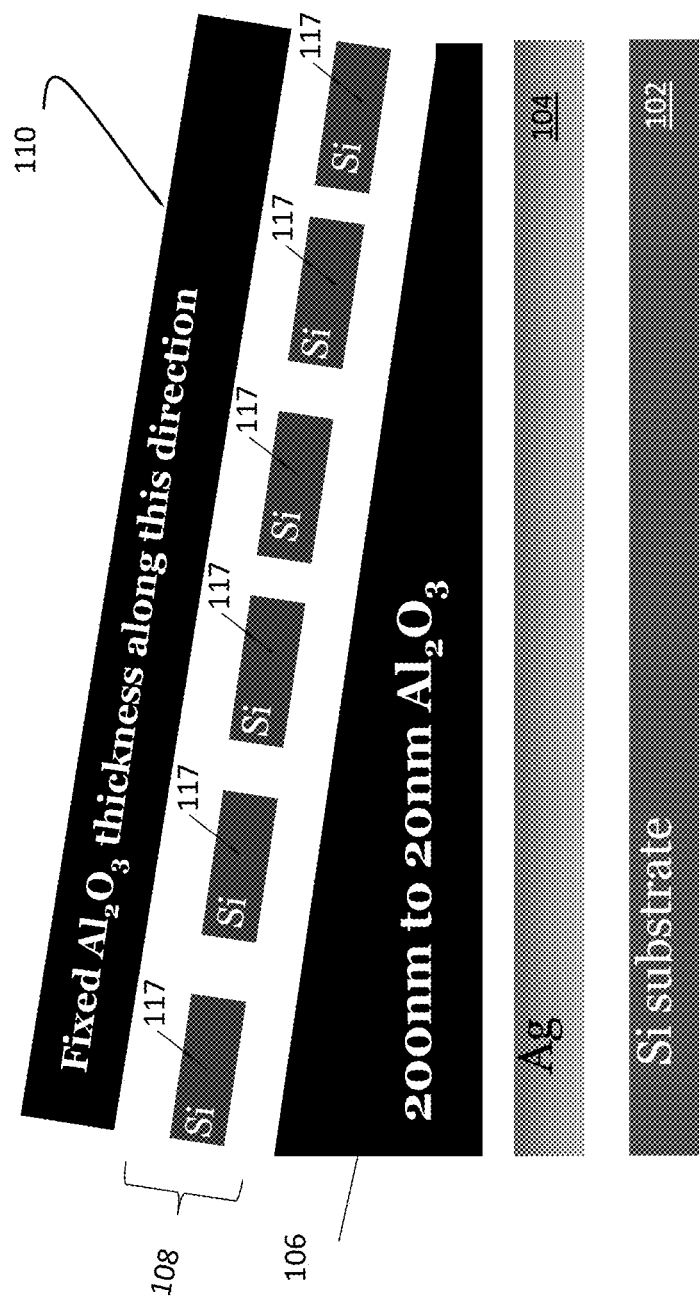
FIG. 1B. Cross-sectional view of the spectrometer of FIG. 1A taken along the x-axis.

One embodiment of a hyperspectral imaging spectrometer is shown schematically in FIGS. 1A-1C. FIG. 1A is an exploded, perspective view of the spectrometer. FIG. 1B and FIG. 1C are cross-sectional views taken along the x and y lateral directions, respectively. Materials and layer thicknesses for the various layers in the spectrometer are shown in the figures. However, these are for illustrative purposes only; other materials and layer thicknesses can be used.

The spectrometer 100 has a vertically stacked structure that includes: a support substrate 102; a reflector 104 over support substrate 102; a first tapered dielectric spacer 106 over reflector 104; an array of pixels 108 comprising photodetectors based on a first type of photosensitive semiconductor nanomembrane 117 and photodetectors based on a second type of photosensitive semiconductor nanomembrane 119; and a second tapered dielectric spacer 110 over the pixel array. First and second dielectric spacers 106, 110 provide optical phase shifting layers. First dielectric spacer 106 has a lower surface 103 that faces toward a reflective surface of reflector 104 and an opposing surface 105 that faces away from reflector 104 and toward second dielectric spacer 110. Second dielectric spacer 110 has an upper surface 107 that faces away from first dielectric spacer 106 and an opposing surface 109 that faces toward first dielectric spacer 106. Dielectric spacer 106 has a thickness gradient along a first lateral direction (shown in FIG. 1A as the x-direction) and dielectric spacer 110 has a thickness gradient along a second lateral direction (shown in FIG. 1A as the y-direction). In the embodiment of a spectrometer of FIGS. 1A-1C, the thickness gradient is a continuous, linear gradient. However, other types of gradients could be used, such as stepped gradients.

As illustrated in FIGS. 1A-1C, the thickness of each dielectric spacer decreases from a maximum thickness to a minimum thickness along the lateral gradient direction, but remains constant along the lateral direction running perpendicular to the lateral gradient direction. The resulting optical cavity has a maximum cavity height at the far corner 120 and a minimum cavity height at the opposite (near) corner 122. Although the lateral thickness gradient directions for the first and second dielectric spacers in the spectrometer of FIGS. 1A-1C are separated by an angle of 90°, other angles of separation can be used. It is further possible for the thickness gradients of the first and second dielectric spacers to be along the same lateral direction. It is further possible for one layer of dielectric to be in the same thickness and the other has a thickness gradient along one desired direction. In addition, although the first and second dielectric spacers of FIGS. 1A-1C have a square perimeter, other perimeter shapes, such as rectangular or circular, can be used.

It should be noted that spatial terms, such as vertically, upper, lower, and over, as used here, are not intended to indicate that the spectrometer must have any absolute orientation with regard to its surroundings; rather, there terms are intended to indicate that the layers in the spectrometer are arranged in a stack starting from the substrate (if present) or the first reflector and extending to the second dielectric spacer. The stack itself may be resting, for example, on its substrate or on its side when it is installed in a larger device.

Together, reflector 104 and first and second dielectric spacers 106, 110 define a resonance cavity having a cavity height gradient, in which photodetectors 108 are arranged in a two-dimensional (2D) array between the dielectric spacers. (In the spectrometer of FIG. 1A, the cavity height dimension is along the z-axis.) The resonance cavity serves to enhance radiation absorption by the light-absorbing photosensitive semiconductor nanomembranes of the photodetectors by increasing the number of light-absorber interactions. The resonance cavity enhances the absorption of radiation at the resonant wavelengths of the cavity via multiple reflections within the cavity. The resonant wavelength at each pixel within the cavity will depend on cavity height, which is determined by the combined thickness of the first and second dielectric spacers. Therefore, by using two dielectric spacers, each tapering along a different lateral direction, the resonance wavelength within the cavity can be varied continuously along both directions. Based on this design, spectrometers can be fabricated in which the resonant cavity height for each photodetector in the array, or each photodetector of the same type in the array, has a different cavity height. However, it is not required that every photodetector in the array has a cavity height that differs from every other photodetector in the array.

The photosensitive semiconductor nanomembranes of the pixel array are thin semiconductor films. The films may be single-crystalline, polycrystalline, or amorphous. However single-crystalline films are generally preferred because they provide higher absorption and faster response times. As used in this disclosure, the term photosensitive semiconductor nanomembrane refers to a semiconductor nanomembrane that is capable of absorbing radiation of desired wavelengths and, as a result, produces a photocurrent or undergoes a measurable temperature change that produces an electric signal output representative of the temperature change. Thus, the term photodetector, as used herein, includes photon detectors and thermal detectors.

The nanomembranes are so called due to their nano-scale thickness dimensions, which correspond to the z-dimension in FIG. 1A. As used herein, a nano-scale dimension is a dimension of 1000 nm or smaller. Generally, the nanomembranes should be thin enough to support narrow-wavelength absorption and wavelength selectivity. In addition, because thinner films produce a lower dark current, ultra-thin nanomembranes are desirable. By way of illustration, some embodiments of the photosensitive semiconductor nanomembranes have a thickness of no greater than 500 nm. This includes embodiments of the photosensitive semiconductor nanomembranes having a thickness of no greater than 400 nm and further includes embodiments of the photosensitive semiconductor nanomembranes having a thickness of no greater than 300 nm. For example, photosensitive semiconductor nanomembranes having thicknesses in the range from 10 nm to 1000 nm, including in the range from 50 nm to 500 nm and in the range from 200 nm to 300 nm, can be used. The lengths and widths of the photosensitive semiconductor nanomembranes may also be, but need not be, nano-scale dimensions. However, in order to achieve a high density of the photodetector pixels in a compact spectrometer, it is desirable for the photosensitive semiconductor nanomembranes to have nano-scale length and width dimensions. By way of illustration only, some embodiments of the photosensitive semiconductor nanomembranes have length and/or width dimensions in the range from about 100 nm to 20000 nm, including in the range from about 100 nm to about 1000 nm.

Pixels 108 of the array may be arranged in a regular 2D pattern, as in a rectilinear array, a square array, or a hexagonal array, on the upper surface of first dielectric spacer 106. However, the pixels need not be arranged in a regular pattern. The pixel array includes at least two photodetectors. However, since a greater number of pixels will provide a higher resolution, the spectrometers desirably include a greater number of photodetectors. By way of illustration, in various embodiments of the spectrometers, the pixel arrays include at least ten, at least 100, or at least 1000 photodetectors. All the photodetectors in the pixel array may use the same type of photosensitive semiconductor nanomembrane. However, it is more desirable for different photodetectors in the array to be based on different types of photosensitive semiconductor nanomembranes that are photosensitive over different wavelength ranges.

A variety of photosensitive semiconductor materials can be used for the photosensitive semiconductor nanomembranes, including single element, alloyed, and compound inorganic semiconductors of Group IV elements, Group II-VI elements and Group III-V elements, and perovskites. Examples of semiconductors from which the thin films can be formed include, diamond, Ge, Si, SiGe, GeSn, SiGeSn, SiGeSnPb, InAs, InGaAs, GaAs, InP, GaInAsP, InGaN, GaN, AlGaN, CdTe, MgCdTe, and HgCdTe. 2D semiconductors can also be used as the nanomembranes. 2D semiconductors are characterized by a 2D bonding geometry in which the atoms are bonded in sheets that are one atomic layer thick. 2D semiconductors include graphene but also include 2D materials other than graphene. In some embodiments, the 2D semiconductor is a transition metal (for example, a Mo-containing or W-containing) dichalcogenide (for example, S, Se, or Te) (TMDC). These include $MoS_2$ but also include TMDCs other than $MoS_2$, such as $WS_2$, $MoTe_2$, $MoSe_2$, $WSe_2$, $SnS_2$, $SnSe_2$, and the like. Nanometer thin phosphorus crystalline films, such as black phosphorus, could also be used. Optionally, the semiconductor of the photosensitive semiconductor nanomembranes may be doped to improve or optimize its bandgap.

The selection of semiconductor materials for the photosensitive semiconductor nanomembranes will depend, at least in part, on the desired wavelength range of operation for the spectrometers. For example, semiconductors that generate electron-hole pairs upon the absorption of radiation in the ultraviolet, visible, and/or infrared, including near infrared, regions of the electromagnetic spectrum may be selected. By way of illustration, silicon is photosensitive in the UV, visible, and near-infrared regions of the electromagnetic spectrum (e.g., from wavelengths around 300 nm to around 1000 nm) and germanium is photosensitive with absorption peaks in the visible and near-infrared regions of the electromagnetic spectrum (e.g., from wavelengths around 600 nm to around 1600 nm). Therefore, by including both silicon nanomembrane-based photodetectors and germanium nanomembrane-based photodetectors in the pixel array, a spectrometer having a photoresponse across the wavelength range from 300 nm to 1600 nm can be fabricated.

A variety of different types of photodetectors can be used. These include MSM photodetectors, which are known for their fast response times; diodes, such as p-i-n type photodiodes; and thermal detectors. One example of a spectrometer that uses MSM type photodetectors is illustrated in the Example. Electrically conductive interconnects for electrically addressing each of the photodetectors and reading out the photodetector output signals can be formed before or after the nanomembrane pixels are formed on the dielectric spacer using suitable deposition methods, such as metal evaporation. A dielectric material can then be deposited around the interconnect structure to fill in the space around the interconnect structure and between the dielectric spacers.

The dielectric materials of the dielectric spacers should be sufficiently electrically insulating so that they do not interfere with the operation or readout of the pixels and to maintain the electrical isolation of the pixels from one another. The dielectric materials also desirably form anti-reflective interfaces with the photosensitive semiconductor nanomembranes in order to minimize or eliminate undesired reflections at those interfaces. In addition, the dielectric material of the spacer through which incident radiation enters the optical cavity should be optically transparent at the intended operational wavelengths of the spectrometer. For example, in the embodiment of the spectrometer shown in FIG. 1A, if the pixels are designed to be photosensitive in the visible and the near infrared regions of the electromagnetic spectrum, the second spacer should transmit visible and near infrared radiation. An optically transparent spacer need not be 100% transparent at the intended operation wavelength, but should be sufficiently transparent for the spectrometer to operate at the specifications required for a given application. Generally, an optical transparency of at least 90%, at least 95%, at least 99%, or at least 99.5% is desired. However, lower levels of optical transparency may be suitable for less demanding applications.

Both dielectric spacers are desirably made from a material that can be formed as a thin film with precise thickness control. Dielectric materials that can be grown via electron beam evaporation, magnetron sputter deposition, chemical vapor deposition, or Atomic Layer Deposition (ALD) are good candidates. These include semimetal oxides and metal oxides, such as $Al_2O_3$, $HfO_2$, $SiO_2$, $TiO_2$, ZnO, MgO, $ZrO_2$, $WO_3$, silicon nitrides ($SiN_x$), and the like. A uni-directionally tapered dielectric film can be formed using a tilted substrate or grayscale photolithography.

The photodetectors of the pixel array can be fabricated by chemical vapor deposition, wafer scale bonding, or thin film transfer printing. For thin film transfer printing, the semiconductor nanomembranes can be patterned into a thin semiconductor film on a sacrificial substrate and then released and transferred onto the surface of the dielectric spacer. For example, the nanomembranes can be patterned into the device layer of a semiconductor-on-insulator substrate and then the underlying buried oxide layer can be selectively etched away to release the nanomembranes. Optionally, the semiconductor nanomembranes may be thinned and polished before or after release. A polymeric stamp, such as a polydimethylsiloxane (PDMS) stamp, can be used to transfer the nanomembranes onto the surface of the dielectric spacer. Notably, because the photosensitive semiconductor nanomembranes need not be grown epitaxially on the dielectric spacer, the materials for the dielectric spacers can be selected independently from the materials of the photosensitive semiconductor nanomembranes, without the need for lattice matching, and the interface formed by a dielectric spacer and the photosensitive semiconductor nanomembranes can be non-epitaxial. As used herein, the term "non-epitaxial interface" refers to an interface in which the crystallographic orientation of an overlying layer is not determined by that of its underlying layer. Thus, in a non-epitaxial interface, the two layers that make up the interface need not have the same crystallographic orientation at the interface. Such non-epitaxial interfaces are free of the strains, stresses, and misfit dislocations that are induced by a lattice mismatch between two materials that are grown epitaxially. In contrast to such epitaxial interfaces, non-epitaxial interfaces have crystallographic orientations that are independent from (e.g., different from) those of their neighboring layers and are free from lattice mismatch-induced strains and stresses.

The thicknesses of the thickest and thinnest parts of the dielectric spacers can be tailored depending on the wavelength range over which the spectrometer is designed to operate, and the first and second dielectric spacers can have different maximum and minimum thickness dimensions. By way of illustration, the thickest part of a spacer may have a thickness in the range from 500 nm to 2000 nm, and the thinnest part of the spacer may have a thickness in the range from 10 nm to 100 nm, such that the thickest part is at least 5 times thicker than the thinnest part. However, thicknesses outside of these ranges may be used. The angle of taper (i.e., the angle formed between the planes of the two opposing surfaces of each dielectric spacer) can be the same for the first and second dielectric spacers, or the two dielectric spacers can have different angles of taper. Appropriate lateral dimensions (length and width) of the spacers will depend on the desired number and density of photodetector pixels and the desired compactness of the device's footprint. By way of illustration, some embodiments of the dielectric spacers will have length and/or width dimensions of 20 mm or smaller, including 10 mm or smaller, and further including 5 mm or smaller.

The reflector of the optical cavity can be provided by a thin film of reflective material that is highly reflective at the operational wavelengths of the spectrometer. However, 100% reflectance is not required; generally, a reflectivity of 80% or higher is desirable, although a lower reflectivity could be used. Thus, more complicated structures, such as distributed feedback reflectors (DBR) are not needed. Metals are good candidates for the reflector material. By way of illustration, silver reflectors can be used for spectrometers that operate in the infrared, including the near infrared, region of the electromagnetic spectrum, and aluminum can be used for spectrometers that operate in the ultraviolet region of the electromagnetic spectrum. However, other metals, such as gold, and even non-metals can also be used. For example, the reflector can be a dielectric-based broadband reflector. Optionally, a second thin film of reflective material on the upper dielectric spacer can be used to define the optical cavity, rather than the dielectric/air interface. For certain UV wavelengths, silicon or other materials that have desired dielectric constants may be used as a reflector [Appl. Phys. Lett. 113, 011111 (2018); doi: 10.1063/1.5038044].

Because all the layers can be thin and have small lateral dimensions, the spectrometers can be fabricated with overall dimensions that render them small enough to fit into small, hand-held electronic devices, such as a cellular phone. By way of illustration, the spectrometers can have overall thicknesses of 1 mm or smaller, 0.5 mm or smaller, 5 µm or smaller, 2 µm or smaller, or even 1 µm or smaller, as measured from the substrate (if present) or from the lower reflector to the upper surface of the second dielectric spacer. The lateral dimensions (width and length) can be, for example, 20 mm or smaller, 10 mm or smaller, or even 1 mm or smaller. For example, spectrometers having overall thicknesses in the range from 100 µm to 1000 µm and/or lateral dimensions in the range from 1 mm to 20 mm can be fabricated.

The spectrometers can be incorporated as part of a larger imaging system that may include one or more of the following components: optics (e.g., lenses) configured to receive electromagnetic radiation and focus or collimate the radiation onto the spectrometer, one or more readout circuits connected to the nanomembrane array and configured to (i.e., specifically designed to) receive output signals from the photodetectors, a processor coupled to the one or more readout circuits and configured to receive the output signals from the one or more readout circuits and generate an image based on the output signals, and a display device, such as a computer screen or cellphone screen, coupled to the processor and configured to display the image generated by the processor. The processor may, optionally, provide one or more of the following functions: data scaling, magnification, data compression, color discrimination, filtering, or other imaging processing. The components of the imaging system can be housed in a protective outer housing.

The processor may be implemented in integrated circuits, as one or more computer programs having computer-executable instructions or code running on one or more computers, as one or more programs running on one or more processors, such as microprocessors, as firmware, or as some combination thereof.

A spectrometer of the type shown in FIGS. 1A-1C that generates a photocurrent upon exposure to incident radiation operates as follows. When the radiation is incident upon photosensitive semiconductor nanomembranes of photodetectors 108, photons having energies greater than the bandgap energy of the photosensitive nanomembranes are absorbed. This absorption results in the photogeneration of charge carries (electron/hole pairs), which can travel through the photosensitive semiconductor nanomembranes under an intrinsic or externally-applied electric field. The continuous separation of the photogenerated electron-hole pairs produces a photocurrent (an output signal) in each pixel, the magnitude of which is proportional to the intensity of the incident radiation. The signal is enhanced by multiple reflections at the resonant wavelengths in the optical cavity of the spectrometer. The output signals generated by the pixels are read out by the readout circuitry, which generates an output for processing by the processor, which generates an image of the object being imaged for display on the display device.

EXAMPLE

Figure 2A:
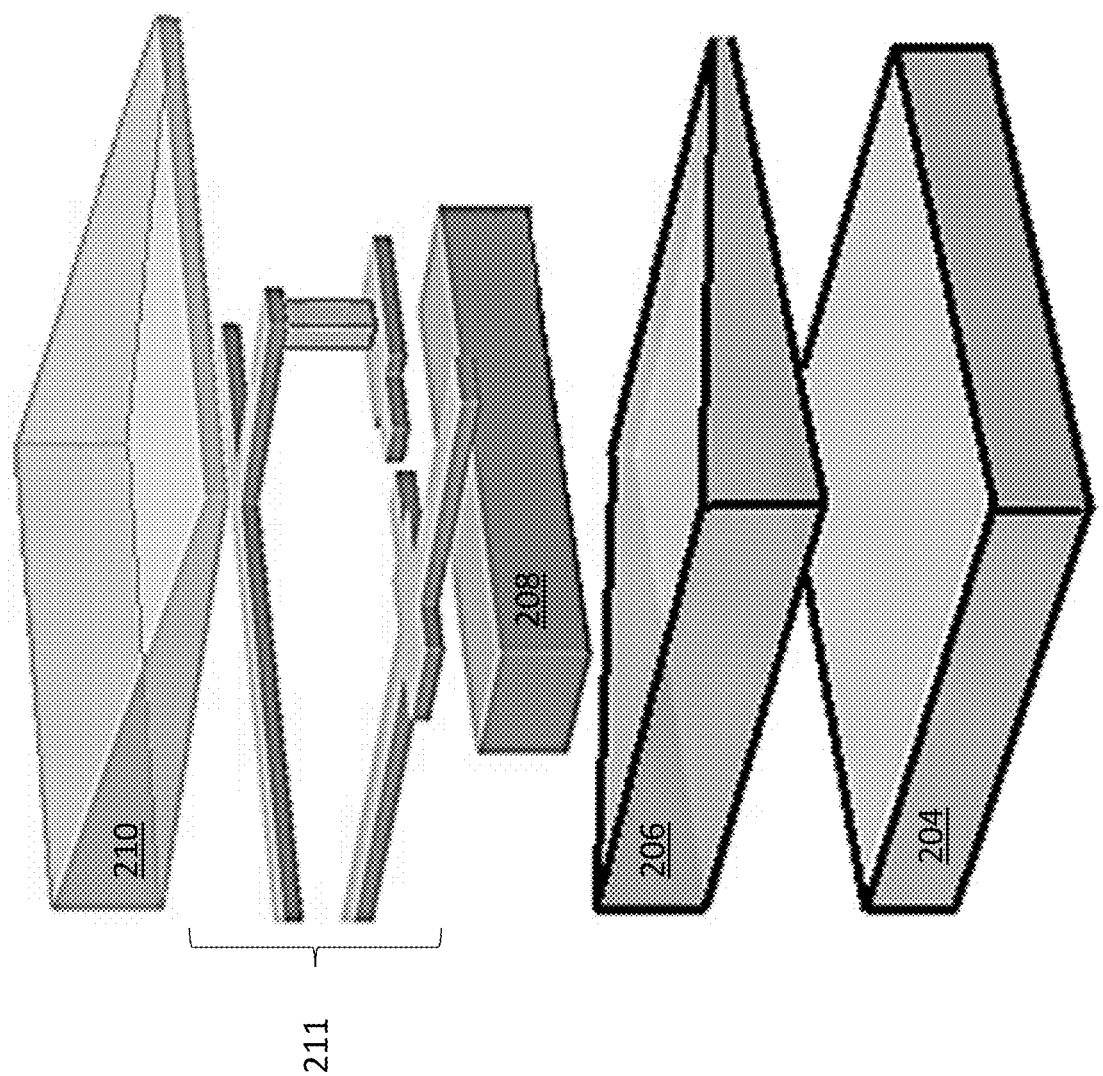
FIG. 2A. Schematic diagram showing an exploded view of a portable spectrometer, including a pixel interconnect structure.
Figure 2B:
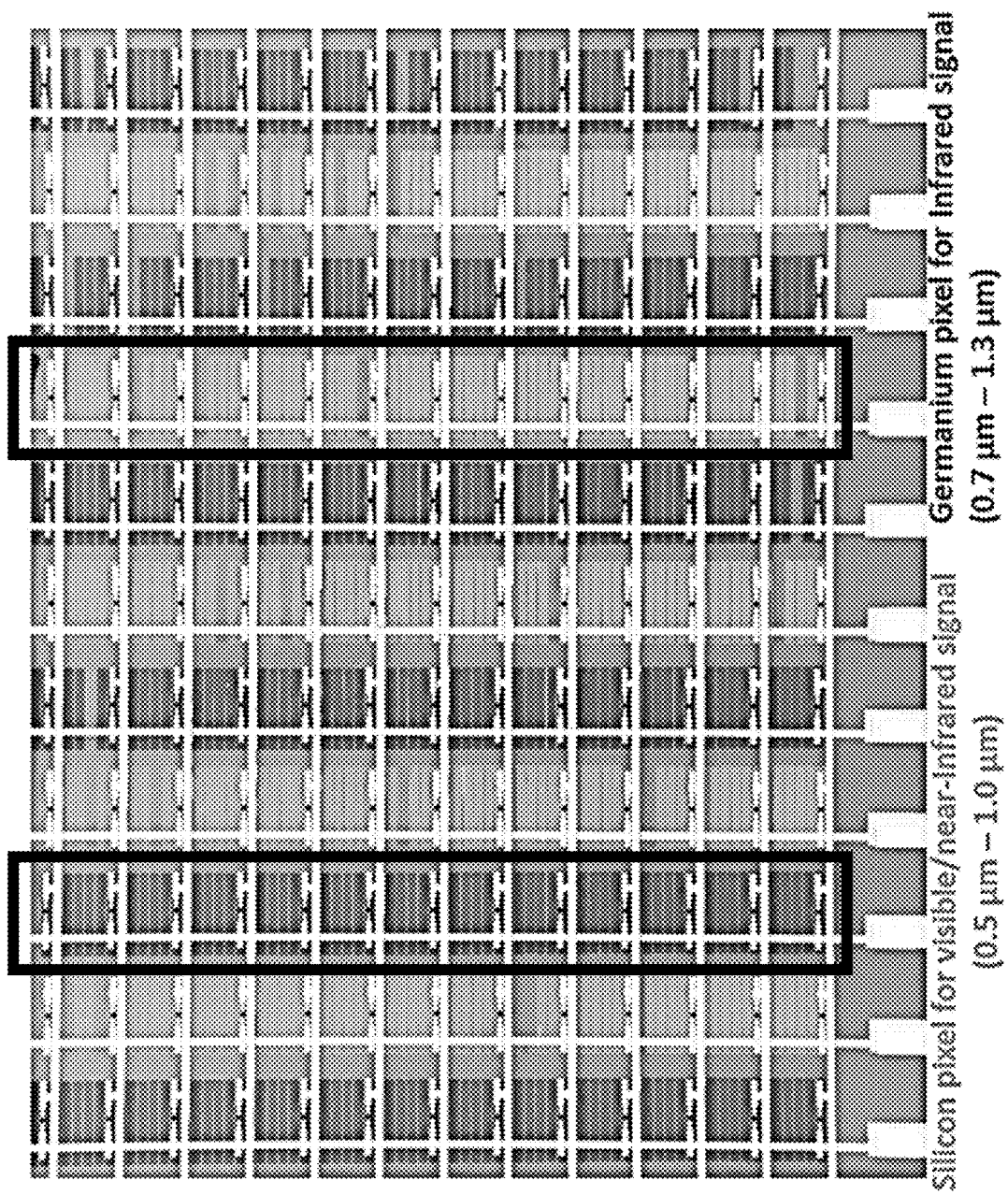
FIG. 2B. Image of the portable spectrometer described in the Example.
Figure 2C:
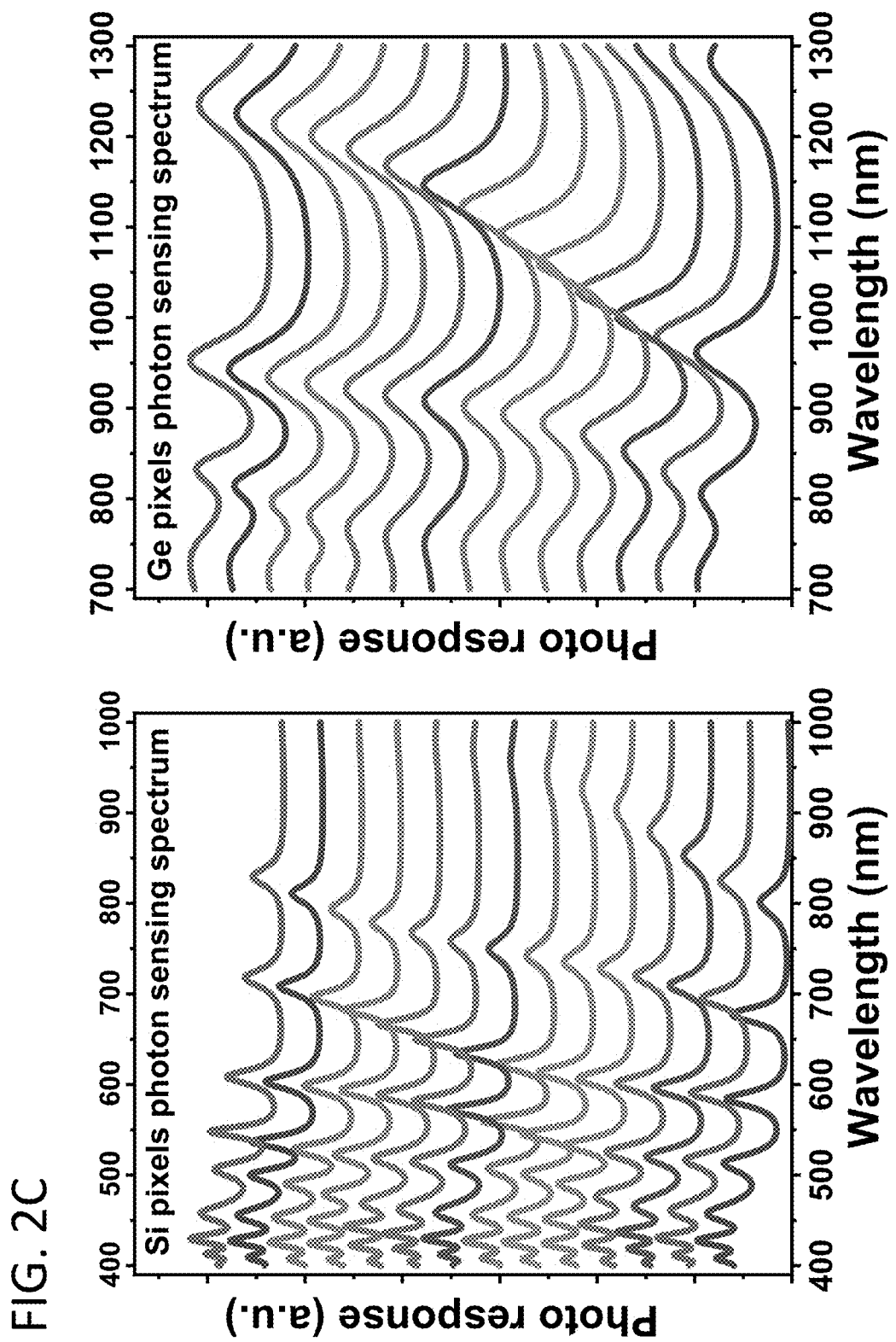
FIG. 2C. Spectrum response of silicon (left) and germanium (right) pixels.

This example demonstrates the fabrication of a spectrometer that uses silicon and germanium nanomembrane-based MSM photodetectors. FIG. 2A is a diagram showing an exploded view of a portion of the structure that contains one pixel. The structure includes an upper dielectric spacer and optical phase shifting layer 210, metal contacts and interconnect structure 211 for detector array signal readout, a photosensitive Si or Ge semiconductor nanomembrane 208, a lower dielectric spacer and optical phase shifting layer 206, and an optical cavity reflector 204. A scanning electron microscope (SEM) image of the device is shown in FIG. 2B. This sample is further tested for the spectrum response. FIG. 2C shows the spectrum response of both silicon pixel and germanium pixel. As the results of the detector design, the response peaks range from visible to infrared wavelengths due to our unique design.

Material and Methods. The bidirectional tapered optical cavity was fabricated as follows. On a silicon substrate, a layer of silver of 60 nm was deposited via e-beam evaporation. A silicon substrate with pre-fabricated CMOS circuitry could be used. The first dielectric layer, with a thickness gradient ranging of 20 nm-420 nm from one side to the opposite side, was deposited using the grayscale deposition method [Kats, M. A. et al. Enhancement of absorption and color contrast in ultra-thin highly absorbing optical coatings. Appl. Phys. Lett. 103, 101104 (2013).] An array of 100 nm-thick patterned silicon nanomembranes was released from a silicon-on-insulator substrate with silicon/buried oxide of 260 nm/handle 400 nm (after thinning down to 100 nm) was transferred printed onto the first dielectric layer. Another array of 100 nm-thick patterned germanium nanomembranes of was released from a germanium-on-insulator substrate with germanium/buried oxide of 260 nm/handle 1000 nm (after thinning down to 100 nm) was also transferred printed onto the first dielectric layer. The two arrays of nanomembranes were arranged in the form of alternating rows or columns with a distance of 10 µm between neighboring columns/rows or in the form of being individually next to each other. A short thermal anneal at a temperature just under 200° C. for 3 minutes enabled firm bonding between the arrays of the nanomembranes and the first dielectric layer.

Using photolithography patterning, metal electrodes with a thickness of 0.25 µm were formed on each of individual pieces of nanomembrane of the mixed array of silicon and germanium nanomembranes to form an array of mixed silicon MSM photodetectors and germanium photodetectors. The second dielectric layer, with a thickness gradient ranging from 20 nm-420 nm from one side to the opposite side, was then deposited on top of the nanomembranes using the grayscale deposition method, completing the fabrication of a bidirectionally tapered optical cavity. Interconnect metal lines were then formed to connect each individual pixel to the connecting pads in a multiplexing method of a CMOS circuitry to complete the chip fabrication of the spectrometer.

Results.

The total thickness of the spectrometer, including the handling substrate, was less than 1 mm. The use of a bidirectionally tapered optical cavity ensured that every MSM photodetector of the spectrometer had a unique spectral response. In the device design illustrated in this example, the thickness of each nanomembrane of the photodetectors was the same to keep the electrical properties of semiconductor nanomembranes the same. However, in other designs, the photosensitive semiconductor nanomembranes in different photodetectors could have different thicknesses to provide an additional degree of freedom for optimizing the operational range and/or resolution of the device.

Figure 3A:
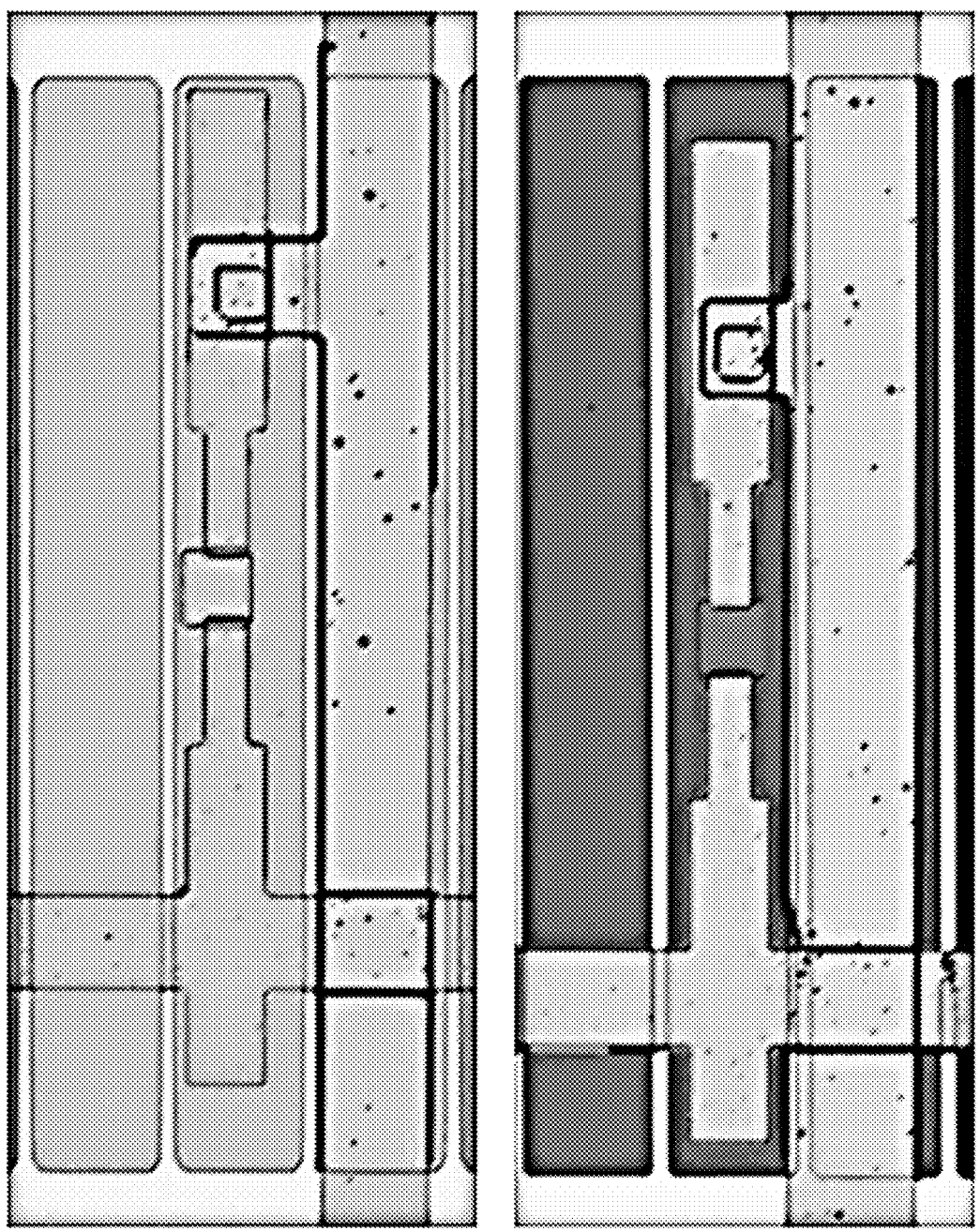
FIG. 3A. Optical image of a single silicon nanomembrane-based metal-semiconductor-metal (MSM) photodetector and a single germanium nanomembrane-based MSM photodetector integrated onto one single chip, as described in the Example.
Figures 3B, 3C:
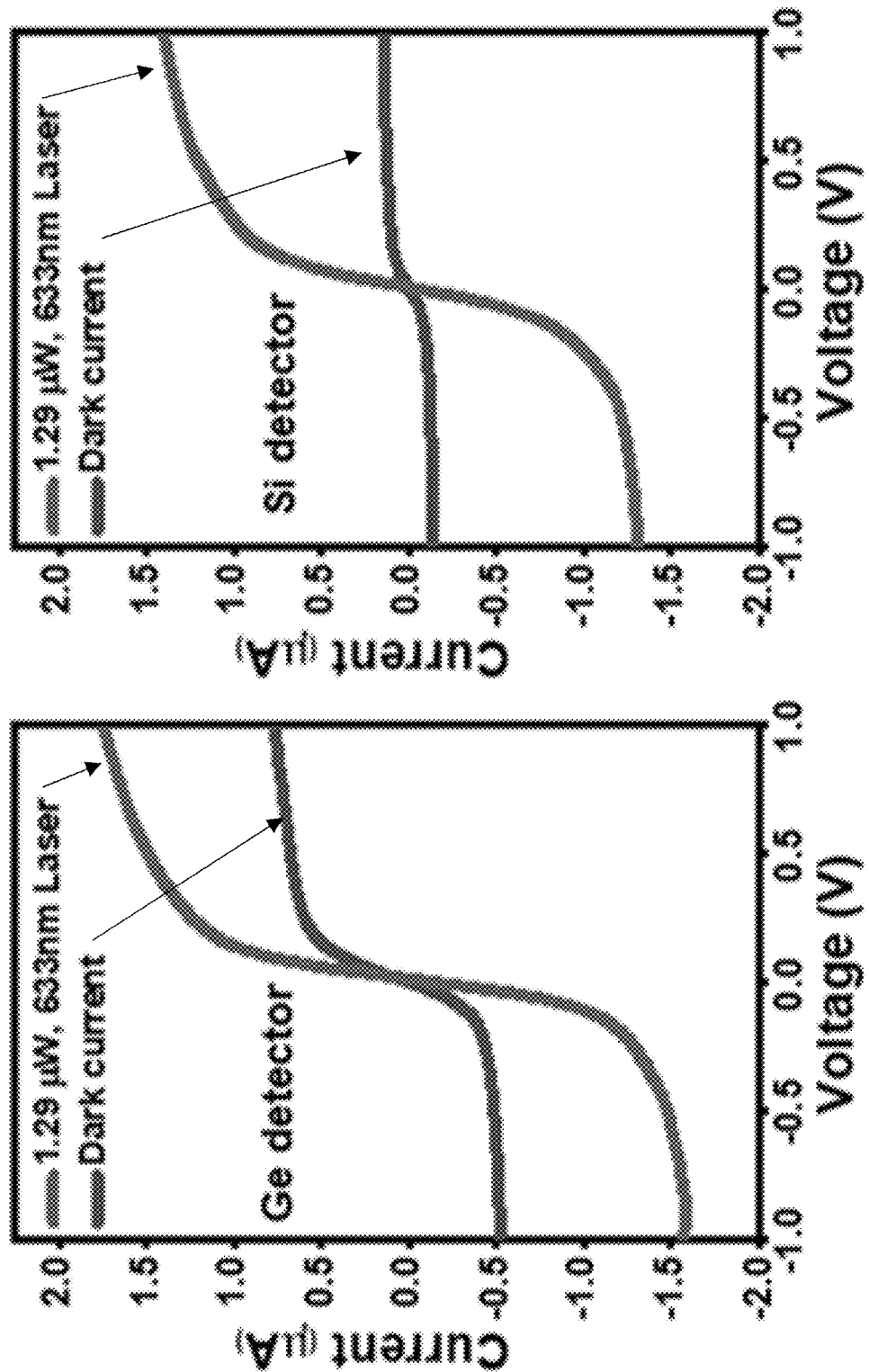
FIG. 3B. Graph of the current-voltage behavior of the germanium-based photodetector of FIG. 3A under dark and illuminated conditions.
FIG. 3C. Graph of the current-voltage behavior of the silicon-based photodetector of FIG. 3A under dark and illuminated conditions.

FIG. 3A shows an image of a silicon nanomembrane-based MSM photodetector and a germanium nanomembrane-based MSM photodetector in the device. The silicon-based MSMs were used to detect radiation with wavelengths in the range from 400 nm to 850 nm, and the germanium-based MSMs were used to detect radiation with wavelengths in the range from 750 nm to 1300 nm. To verify that the MSM photodetectors were working, the current-voltage behavior of each photodetector on the chip was tested. FIGS. 3B and 3C show the typical current-voltage behavior of a germanium-based MSM photodetector (FIG. 3B) and a silicon-based MSM photodetector (FIG. 3C) under dark and illuminated conditions. The photo responsivity was about 0.2 A/W for the silicon-based MSM detector and 0.6 A/W for the germanium-based MSM detector. The entire fabricated spectrometer chip was wire bonded to the external PCB (printed circuit board) board. This illustrative spectrometer contained 100 silicon nanomembrane-based pixels and another 100 germanium nanomembrane-based pixels.

Figure 4A:
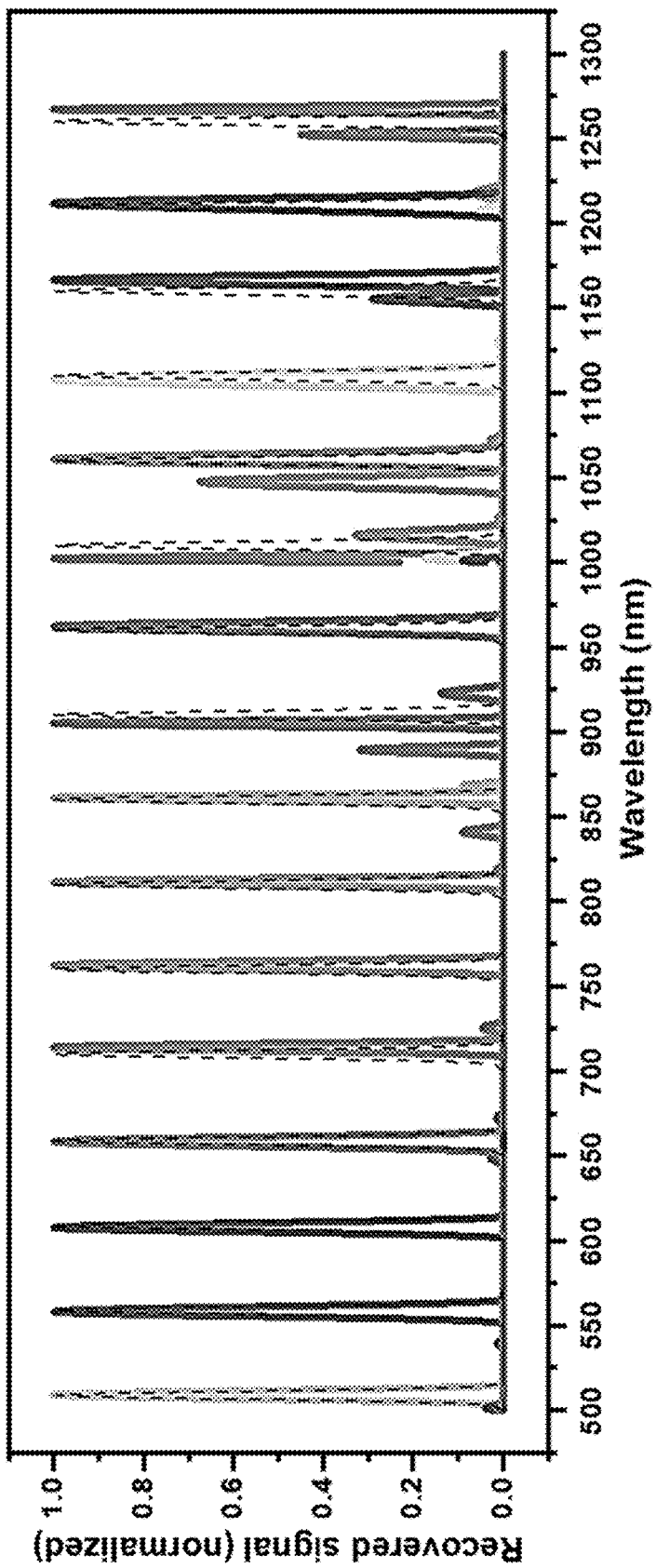
FIG. 4A. Graph of the recovered spectrum signal from the portable spectrometer described in the Example.

FIG. 4A shows a spectrum resulting from a well-calibrated light signal. The results were obtained as follows: first, the spectral response $R_i(\lambda)$ (i=1, 2, 3, ... n; where i represents the number of the photodetectors) was measured for each of the 200 photodetectors via an automated photo responsivity setup; second, the device photo response was studied under a well-calibrated light source and the photo current signals $I_i$ (i=1, 2, 3, ... n) for each of the photodetectors was measured. The measured photocurrent data, together with the pre-calibrated response functions, were then processed to reconstruct the spectrum by solving a system of linear equations:

$$\int_{\lambda_1}^{\lambda_2} F(\lambda) R_i(A) d\lambda = I_i (i=1,2,3 \ldots ,n),$$

where $\lambda_1$ and $\lambda_1$ define the spectrometer's operational wavelength range, in this case, from 500 nm to 1300 nm. For a spectrometer with n detector elements, there are n sets of equations. Solving these equations by ordinary non-iterative methods can be done by writing a script in Matlab. However, other methods, including the adaptive Tikhonov regularization scheme method, can also be used to further reduce the noise level in the recovered spectrum and to enhance the spectrum resolution. From FIG. 4A, it can be seen that in the wavelength range of 500 nm to 1300 nm, each light signal peak location and the signal full-width at half maximum were well resolved.

Figure 4B:
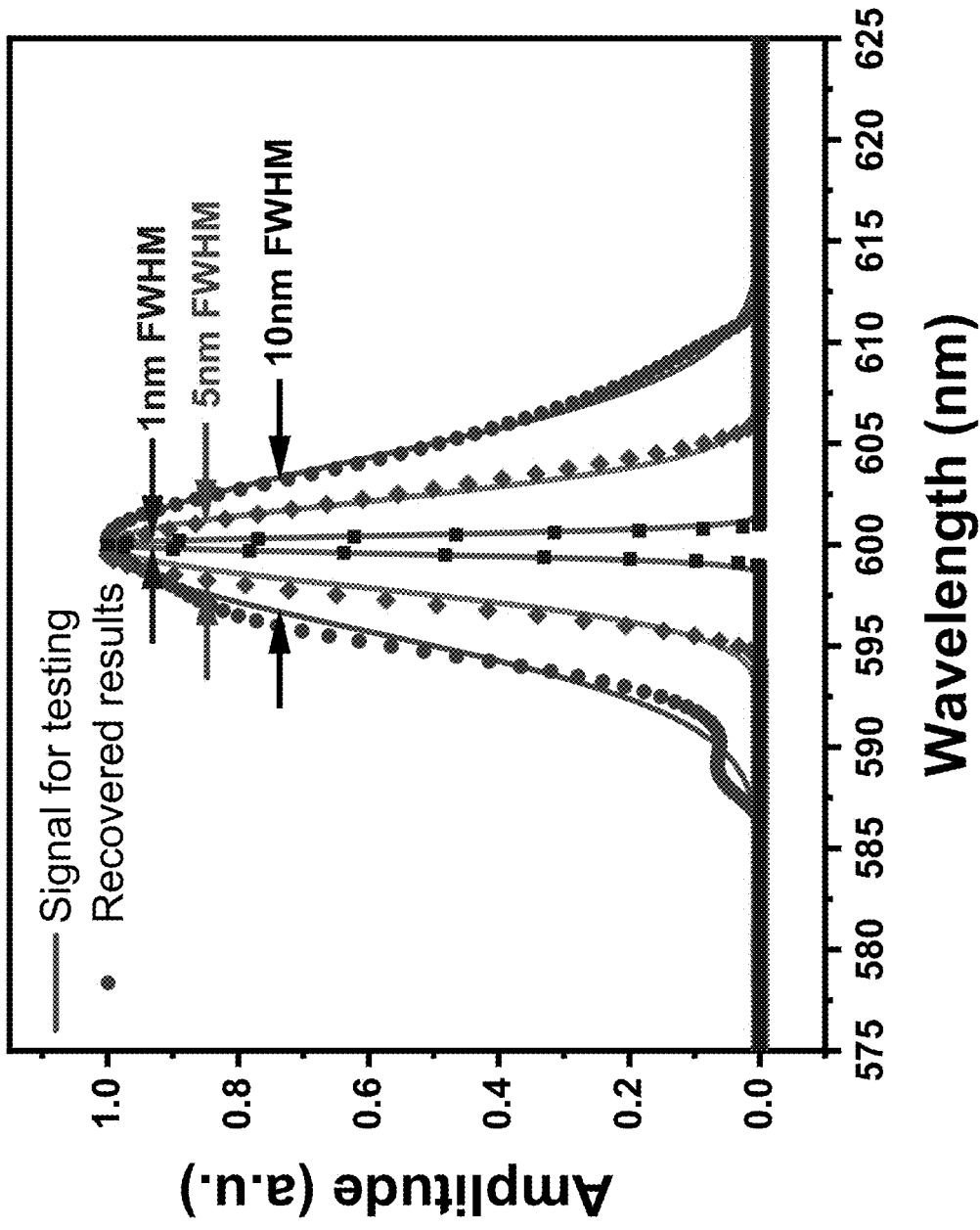
FIG. 4B. Wavelength resolution of spectrum recovery of the silicon pixels.
Figure 4C:
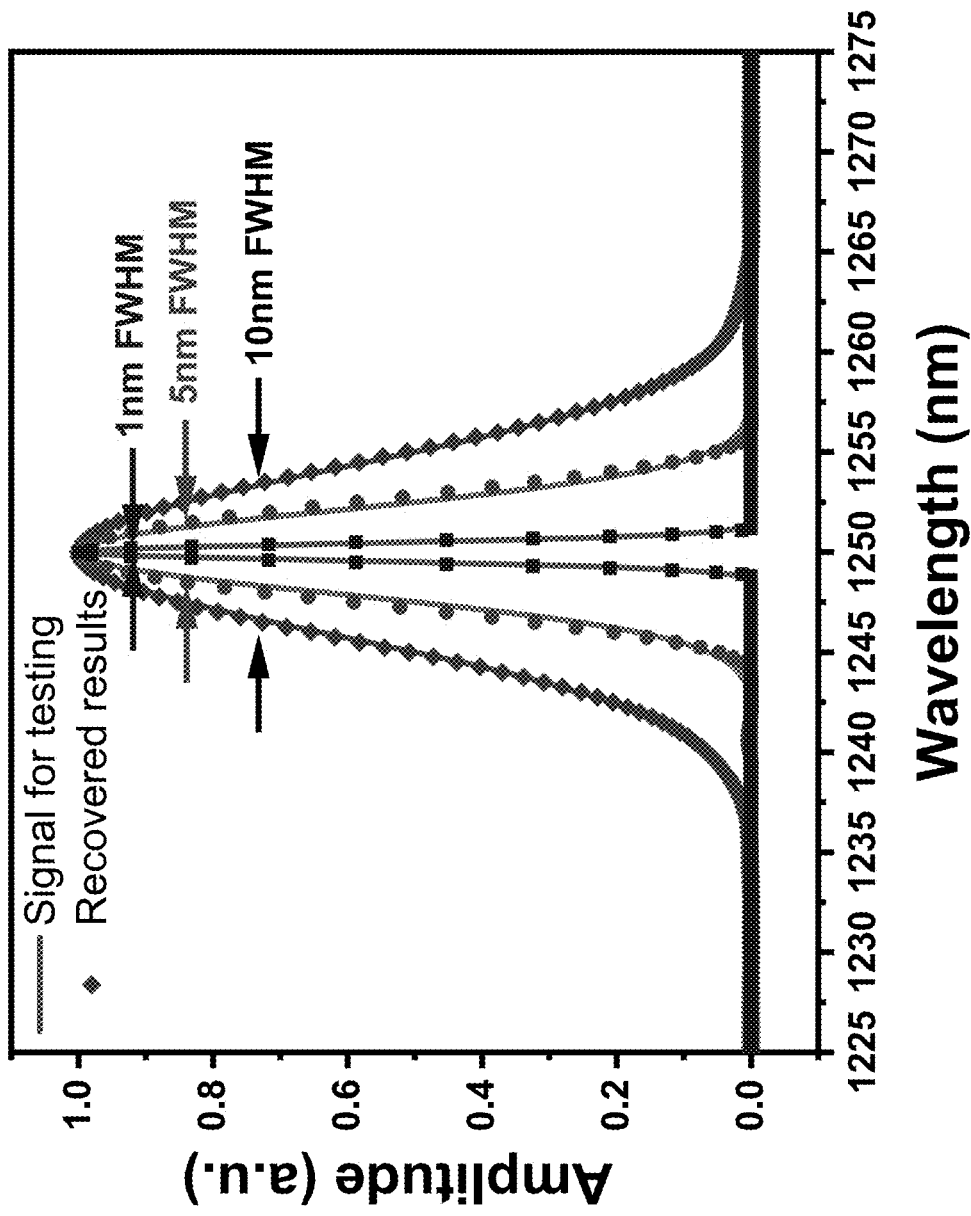
FIG. 4C. Wavelength resolution of spectrum recovery of the germanium pixels.

The wavelength resolution that a spectrometer can recover reflects the performance of the spectrometer. The spectrum recovery resolutions of both the silicon pixels and the germanium pixels were characterized. FIG. 4B shows the spectrum recovery resolution of the silicon pixels. The spectrometer exhibits 1 nm wavelength resolution characterized by the full-width at half maximum (FWHM) of the signals. FIG. 4C shows the spectrum recovery resolution of the germanium pixels, also exhibiting 1 nm resolution recover capability.

Figure 4D:
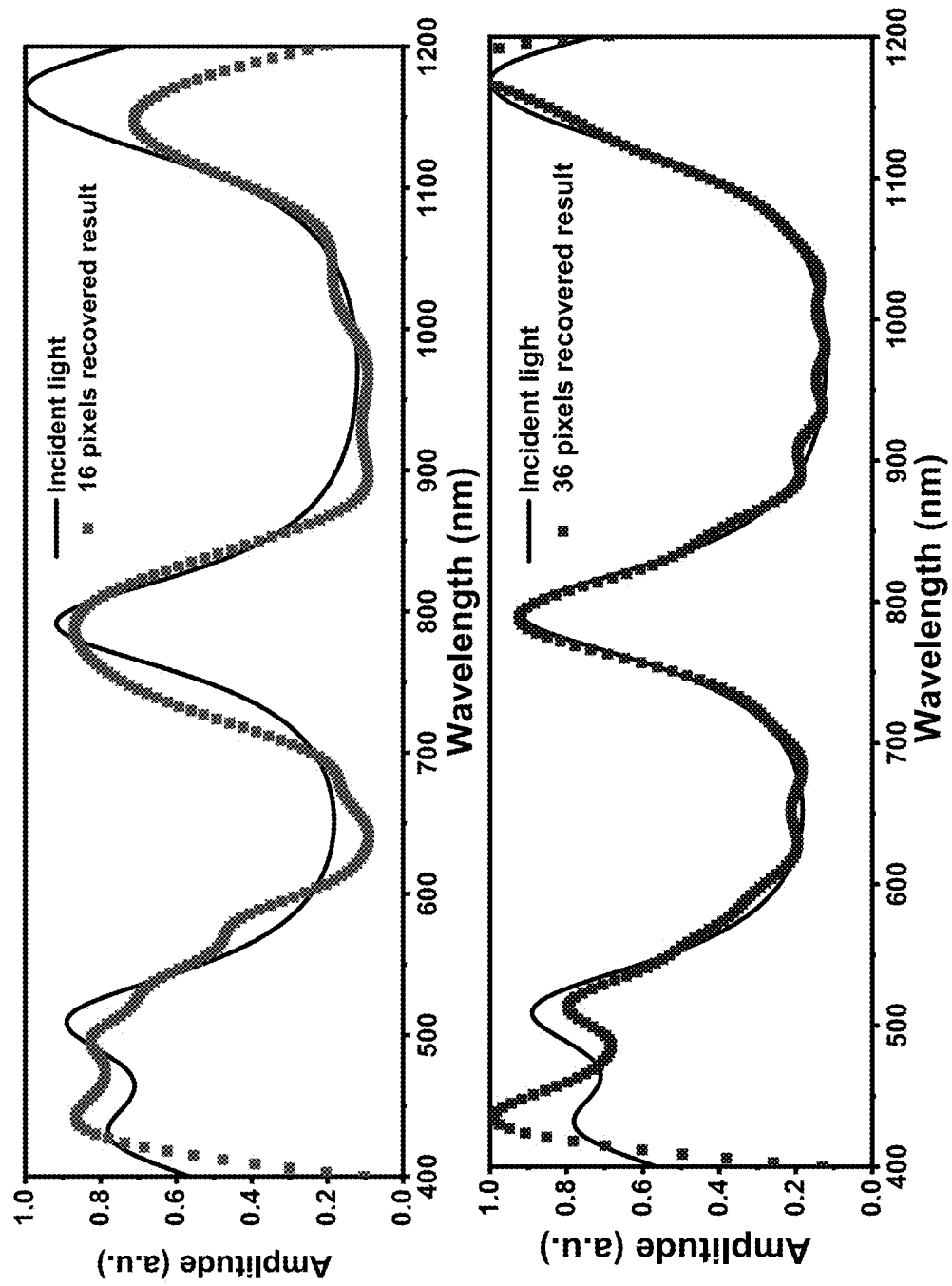
FIG. 4D. Graph of a recovered broadband spectrum and its comparison with pre-calibrated signal.

FIG. 4D shows a recovered broadband signal using the spectrometer under two conditions: 16 pixels and 36 pixels. When 16 pixels were used for signal recovery, the goodness of fit was 0.8546. When 36 pixels were used for signal recovery, the goodness of fit was 0.9237. A goodness of fit of 0.9991 can be reached with 128×128 pixels, a size easily fabricated with a commercial foundry.

The upper limit of the spectrometer recover resolution in the wavelength range of 400 nm to 1300 nm was also measured. The data show that upper resolution can reach 1 nm for every wavelength from the above referenced wavelength range.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A resonant cavity spectrometer comprising:
   a reflector;
   a first dielectric spacer disposed over the reflector, the first dielectric spacer having a thickness gradient along a lateral direction;
   a second dielectric spacer disposed above the first dielectric spacer, the second dielectric spacer having a thickness gradient along a lateral direction; and
   a pixel array comprising a plurality of photodetectors, the photodetectors comprising photosensitive semiconductor nanomembranes, disposed between the first dielectric spacer and the second dielectric spacer, wherein the reflector, the first dielectric spacer, and the second dielectric spacer define a resonant cavity having a cavity height gradient along at least one lateral direction.

2. The spectrometer of claim 1, wherein the thickness gradient of the first dielectric spacer is along a first lateral direction and the thickness gradient of the second dielectric spacer is along a second lateral direction that is different from the first lateral direction.

3. The spectrometer of claim 1, wherein the first lateral direction and the second lateral direction are separated by an angle of 90°.

4. The spectrometer of claim 1, wherein one or more of the photodetectors comprises a first photosensitive semiconductor nanomembrane and one or more of the photodetectors comprises a second photosensitive semiconductor nanomembrane.

5. The spectrometer of claim 4, wherein the first photosensitive semiconductor nanomembrane is a silicon nanomembrane and the second photosensitive semiconductor nanomembrane is a germanium nanomembrane.

6. The spectrometer of claim 1, wherein the photosensitive semiconductor nanomembranes comprise photosensitive semiconductor nanomembranes that are photosensitive in the visible region of the electromagnetic spectrum, the near infrared region of the electromagnetic spectrum, or both the visible and the near infrared regions of the electromagnetic spectrum.

7. The spectrometer of claim 1, wherein the photodetectors are metal-semiconductor-metal photodetectors.

8. The spectrometer of claim 1, wherein the pixel array comprises at least one hundred photodetectors.

9. The spectrometer of claim 1, wherein the resonant cavity has a maximum resonant cavity height of no greater than 5 μm.

10. The spectrometer of claim 1, wherein a maximum thickness of the thickness gradients of the first and second dielectric spacers is in the range from 500 nm to 2000 nm and a minimum thickness of the thickness gradient of the first and second dielectric spacers is in the range from 10 nm to 100 nm.

11. The spectrometer of claim 1, wherein the first and second dielectric spacers have a maximum lateral dimension of 20 mm or smaller and a combined height of the reflector, the first dielectric spacer, and the second dielectric spacer is less than 1 mm.

12. The spectrometer of claim 11, wherein the pixel array comprises at least one hundred photodetectors.

13. The spectrometer of claim 1, wherein the first and second dielectric spacers comprise a metal oxide, or a nitride, or a semimetal oxide.

14. The spectrometer of claim 1, wherein the pixel array comprises at least one hundred photoconductors, the photoconductors include metal-semiconductor-metal photodetectors comprising silicon nanomembranes and metal-semiconductor-metal photodetectors comprising germanium nanomembranes, and the first and second dielectric spacers comprise aluminum oxide.

15. The spectrometer of claim 14, wherein the first and second dielectric spacers have a maximum lateral dimension of 20 mm or smaller and a combined height of the reflector, the first dielectric spacer, and the second dielectric spacer is less than 1 mm.

16. The spectrometer of claim 15, wherein the thickness gradient of the first dielectric spacer is along a first lateral direction and the thickness gradient of the second dielectric spacer is along a second lateral direction that is different from the first lateral direction.

17. The spectrometer of claim 16, wherein the first lateral direction and the second lateral direction are separated by an angle of 90°.

18. The spectrometer of claim 1, wherein the resonant cavity height is different for every photodetector in the pixel array.

19. The spectrometer of claim 1, further comprising:
a readout circuit connected to the photodetectors in the pixel array and configured to receive output signals from the photodetectors;
a processor coupled to the readout circuit and configured to generate an image based on the output signals; and
a display device coupled to the processor and configured to display the image generated by the processor.

* * * * *

UNITED STATES PATENT AND TRADEMARK OFFICE
CERTIFICATE OF CORRECTION

| | |
|---|---|
| PATENT NO. | : 11,894,399 B2 |
| APPLICATION NO. | : 17/189394 |
| DATED | : February 6, 2024 |
| INVENTOR(S) | : Ma et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 513 days.

Signed and Sealed this
First Day of July, 2025

Coke Morgan Stewart
*Acting Director of the United States Patent and Trademark Office*